US012765125B2

(12) United States Patent
Huang et al.

(10) Patent No.: US 12,765,125 B2
(45) Date of Patent: Oct. 13, 2026

(54) LED CIRCUIT BOARD STRUCTURE, LED TESTING AND PACKAGING METHOD AND LED PIXEL PACKAGE

(71) Applicant: INGENTEC CORPORATION, Miaoli County (TW)

(72) Inventors: Yi-Chuan Huang, Miaoli County (TW); Hsiao-Lu Chen, Miaoli County (TW); Ai-Sen Liu, Miaoli County (TW)

(73) Assignee: INGENTEC CORPORATION, Miaoli County (TW)

( * ) Notice: Subject to any disclaimer, the term of this patent is extended or adjusted under 35 U.S.C. 154(b) by 791 days.

(21) Appl. No.: 18/057,231

(22) Filed: Nov. 21, 2022

(65) Prior Publication Data

US 2024/0006557 A1 Jan. 4, 2024

(30) Foreign Application Priority Data

Jun. 29, 2022 (TW) .................................. 111124310

(51) Int. Cl.
*H10H 20/83* (2025.01)
*H05B 45/37* (2020.01)

(52) U.S. Cl.
CPC ............. *H10H 20/83* (2025.01); *H05B 45/37* (2020.01)

(58) Field of Classification Search
CPC ......... H01L 22/30; H01L 22/32; H01L 22/34; H01L 22/10; H01L 22/20; H01L 25/167; H01L 25/0753; H05K 1/18; H10H 20/857; H10H 29/24; H10H 29/857; H10H 29/852; H10H 20/0364; H10H 20/0362; H10H 20/021; H10H 20/8508; H10H 29/14;

(Continued)

(56) References Cited

U.S. PATENT DOCUMENTS

2018/0254226 A1* 9/2018 Iguchi .................... G09G 3/006
2022/0165918 A1* 5/2022 Bower ..................... G09G 3/20

FOREIGN PATENT DOCUMENTS

JP 2007-157761 A 6/2007
JP 2014072330 A * 4/2014

(Continued)

OTHER PUBLICATIONS

JP-2014072330-A PE2E English Machine Translation, Author: Nezu Hideaki (Year: 2014).*

(Continued)

*Primary Examiner* — Julio J Maldonado
*Assistant Examiner* — Alexander Michael Miller
(74) *Attorney, Agent, or Firm* — CKC & Partners Co., LLC

(57) ABSTRACT

An LED circuit board structure includes first color LEDs, second color LEDs, third color LEDs, integrated circuit chips, a carrier board, first P-type pads, first color pads, first testing wires and first connecting wires. One of the first P-type pads is disposed at a pixel-front-side-pattern region for mounting a first P-type electrode. One of the first color pads is disposed at the pixel-front-side-pattern region for mounting a first pin of the integrated circuit chip. The first color pad electrically connects to the first P-type pad. A first testing wire is disposed at the pixel-front-side-pattern region and extends from the first P-type pad or the first color pad. The first connecting wire electrically connects two first testing wires in adjacent two pixel-front-side-pattern regions in parallel.

6 Claims, 9 Drawing Sheets

(58) Field of Classification Search
CPC .. H10H 29/142; H10H 29/8508; H10H 29/85; H10H 29/8506; H10H 20/8506; H10H 20/83; H10W 74/014; H10W 90/00; H10P 74/27–277; H10P 74/23
See application file for complete search history.

(56) References Cited

FOREIGN PATENT DOCUMENTS

| | | | |
|---|---|---|---|
| JP | 2019-220726 | A | 12/2019 |
| JP | 2020-053274 | A | 4/2020 |
| JP | 2020-057015 | A | 4/2020 |

OTHER PUBLICATIONS

JP-2014072330-A Espacenet English Machine Translation (Author: Nezu Hideaki) (Year: 2014).*

* cited by examiner

4000

LED CIRCUIT BOARD STRUCTURE, LED TESTING AND PACKAGING METHOD AND LED PIXEL PACKAGE

RELATED APPLICATIONS

This application claims priority to Taiwan Application Serial Number 111124310 filed Jun. 29, 2022, which is herein incorporated by reference.

BACKGROUND

Technical Field

The present disclosure relates to a circuit board structure, a testing and packaging method, and a pixel package. More particularly, the present disclosure relates to an LED circuit board structure, an LED testing and packaging method, and an LED pixel package.

Description of Related Art

With the popularization of personal display devices, the miniaturization of LED (light emitting diode) structures has become a trend in the industry. As the sizes of the LEDs scale down, the sizes of the LED pixel packages are reduced accordingly. To ensure the yield rate, LED pixel packages need to be tested. In the conventional LED pixel packaging and testing technology, the LED pixel packages are tested one by one after sealing. However, the small sizes and large quantity of LED pixel packages make the measurements difficult and time-consuming. In addition, if a defect is found after sealing, the entire LED pixel package has to be discarded, resulting in a waste of cost. If there is an integrated circuit chip disposed in the LED pixel package for driving the LEDs, it becomes more difficult to test after packaging. Therefore, to improve the testing efficiency of the LED pixel package and to save the cost are the goals to be achieved in the related field.

SUMMARY

According to one aspect of the present disclosure, an LED circuit board structure includes a plurality of first color LEDs, a plurality of second color LEDs, a plurality of third color LEDs, a plurality of integrated circuit chips, a carrier board, a plurality of first P-type pads, a plurality of second P-type pads, a plurality of third P-type pads, a plurality of first color pads, a plurality of second color pads, a plurality of third color pads, a plurality of first testing wires and a plurality of first connecting wires. Each of the first color LEDs includes a first P-type electrode and a first N-type electrode, each of the second color LEDs includes a second P-type electrode and a second N-type electrode, and each of the third color LEDs includes a third P-type electrode and a third N-type electrode. Each of the integrated circuit chips electrically connects each of the first color LEDs, each of the second color LEDs and each of the third color LEDs. The carrier board includes a carrying surface and a bottom surface opposite to each other. The carrying surface includes a plurality of pixel-front-side-pattern regions disposed in intervals. The bottom surface includes a plurality of pixel-back-side-pattern regions respectively corresponding to the pixel-front-side-pattern regions. One of the first color LEDs, one of the second color LEDs, one of the third color LEDs and one of the integrated circuit chips are disposed in one of the pixel-front-side-pattern regions. The first P-type pads are located at the carrying surface of the carrier board, and one of the first P-type pads is disposed at one of the pixel-front-side-pattern regions for mounting one of the first P-type electrodes. The second P-type pads are located at the carrying surface of the carrier board, and one of the second P-type pads is disposed at one of the pixel-front-side-pattern regions for mounting one of the second P-type electrodes. The third P-type pads are located at the carrying surface of the carrier board, and one of the third P-type pads is disposed at one of the pixel-front-side-pattern regions for mounting one of the third P-type electrodes. The first color pads are located at the carrying surface of the carrier board. One of the first color pads is disposed at one of the pixel-front-side-pattern regions for mounting a first pin of the integrated circuit chip that is disposed at the same pixel-front-side-pattern region, and for electrically connecting the first P-type pad that is disposed at the same pixel-front-side-pattern region. The second color pads are located at the carrying surface of the carrier board. One of the second color pads is disposed at one of the pixel-front-side-pattern regions for mounting a second pin of the integrated circuit chip that is disposed at the same pixel-front-side-pattern region, and for electrically connecting the second P-type pad that is disposed at the same pixel-front-side-pattern region. The third color pads are located at the carrying surface of the carrier board. One of the third color pads is disposed at one of the pixel-front-side-pattern regions for mounting a third pin of the integrated circuit chip that is disposed at the same pixel-front-side-pattern region, and for electrically connecting the third P-type pad that is disposed at the same pixel-front-side-pattern region. The first testing wires are located at the carrying surface of the carrier board, and one of the first testing wires is disposed at one of the pixel-front-side-pattern regions and extends from the first P-type pad or the first color pad that is disposed at the same pixel-front-side-pattern region. Each of the first connecting wires electrically connects two of the first testing wires of adjacent two of the pixel-front-side-pattern regions in parallel.

According to another aspect of the present disclosure, an LED testing and packaging method includes an integrated circuit chip mounting step, an LED mounting step, an LED testing step and a carrier board cutting step. In the integrated circuit chip mounting step, a plurality of integrated circuit chips are mounted to a circuit board. In the LED mounting step, a plurality of first color LEDs, a plurality of second color LEDs and a plurality of third color LEDs are mounted to a circuit board. The circuit board includes a carrier board, a plurality of first P-type pads, a plurality of first color pads, a plurality of first testing wires, a plurality of first connecting wires and a plurality of cutting lanes. The carrier board includes a carrying surface and a bottom surface opposite to each other. The carrying surface includes a plurality of pixel-front-side-pattern regions disposed in intervals. The bottom surface includes a plurality of pixel-back-side-pattern regions respectively corresponding to the pixel-front-side-pattern regions. The first P-type pads are located at the carrying surface of the carrier board, and one of the first P-type pads is disposed at one of the pixel-front-side-pattern regions for mounting one of the first color LEDs. The first color pads are located at the carrying surface of the carrier board. One of the first color pads is disposed at one of the pixel-front-side-pattern regions for mounting a first pin of one of the integrated circuit chips, and for electrically connecting the first P-type pads that is disposed at the same pixel-front-side-pattern region. The first testing wires are located at the carrying surface of the carrier board. One of the first testing wires is disposed at one of the pixel-front-side-pattern regions and extends from the first P-type pad or the first color pad that is disposed at the same pixel-front-side-pattern region. Each of the first connecting wires electrically connects two of the first testing wires of adjacent two of the pixel-front-side-pattern regions in parallel. The cutting lanes are located at the carrier board and are located between each of the pixel-front-side-pattern regions. A part of each of the first connecting wires is located at the cutting lanes. In the LED testing step, the first connecting wires are powered to test each of the first color LEDs. An electric current flows from one of the first connecting wires into one of the first testing wires and flows into one of the first color LEDs through one of the first P-type pads or through one of the first color pads and one of the first P-type pads. In carrier board cutting step, the carrier board is cut along the cutting lanes such that the pixel-front-side-pattern regions separate from each other and the first connecting wires or the first testing wires are cutting off to form a plurality of pixels to be packaged.

According to still another aspect of the present disclosure, an LED pixel package includes a carrier board, a first color LED, a second color LED, a third color LED, an integrated circuit chip, a sealing layer and a first wire set. The carrier board includes a carrying surface. The first color LED is disposed on the carrying surface. The second color LED is disposed on the carrying surface. The third color LED is disposed on the carrying surface. The integrated circuit chip is disposed on the carrying surface and electrically connects the first color LED, the second color LED and the third color LED. The sealing layer covers the first color LED, the second color LED, the third color LED and the integrated circuit chip. The first wire set is disposed at the carrying surface and electrically connects the first color LED and the integrated circuit chip. A part of the first wire set extends from the first color LED or the integrated circuit chip to an edge of the carrier board. A top surface of the part is higher than the carrying surface of the carrier board to form a metal break surface at the edge.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
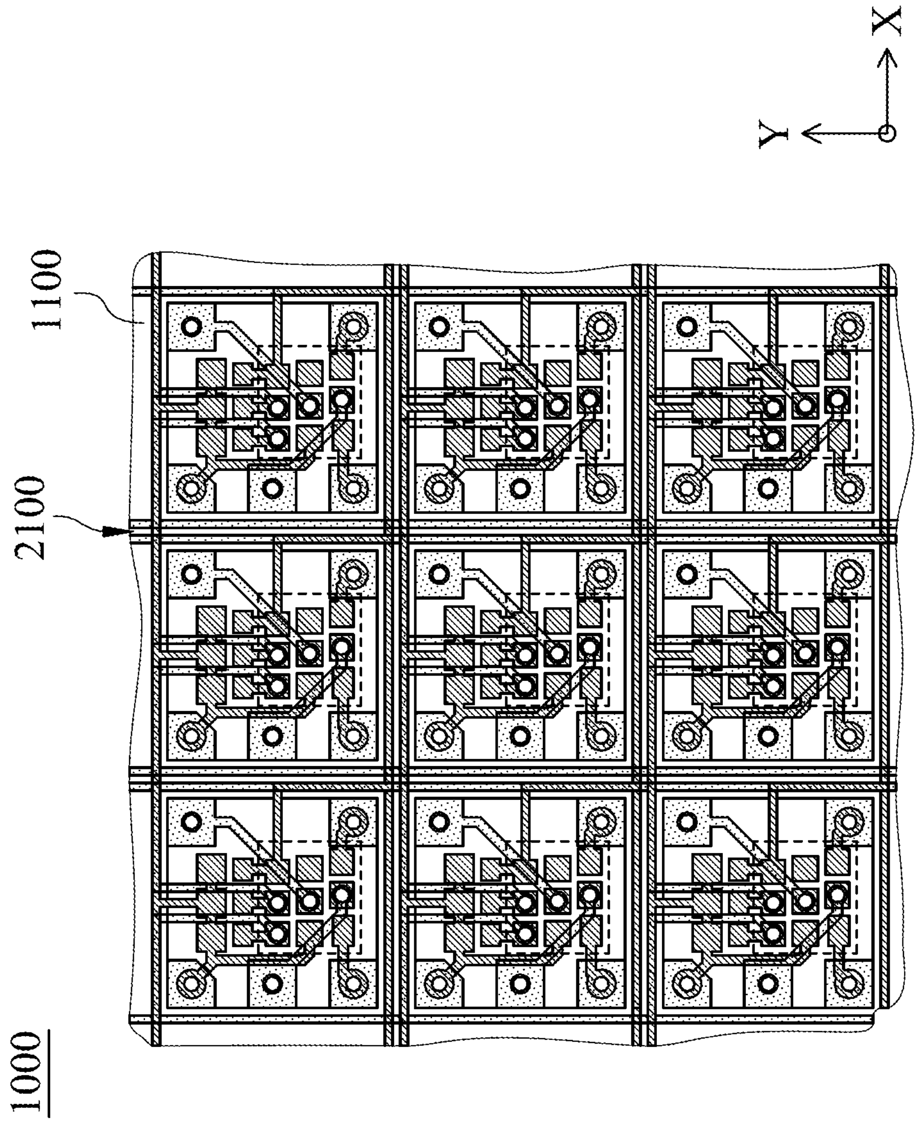
FIG. 1 is a top perspective view of an LED circuit board structure according to one embodiment of the present disclosure.
Figure 2:
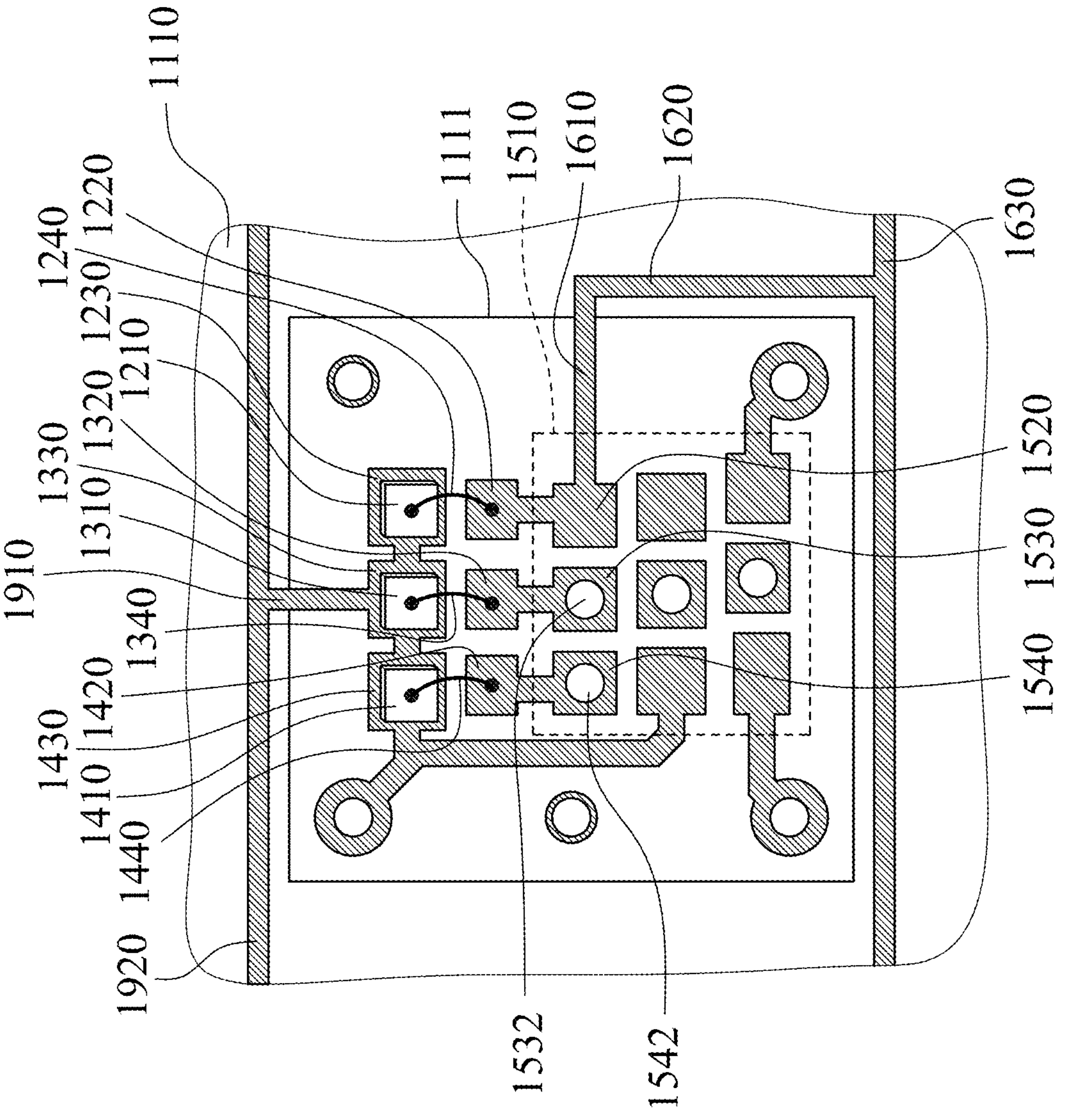
FIG. 2 is a pixel-front-side-pattern region of the LED circuit board structure according to FIG. 1.
Figure 3:
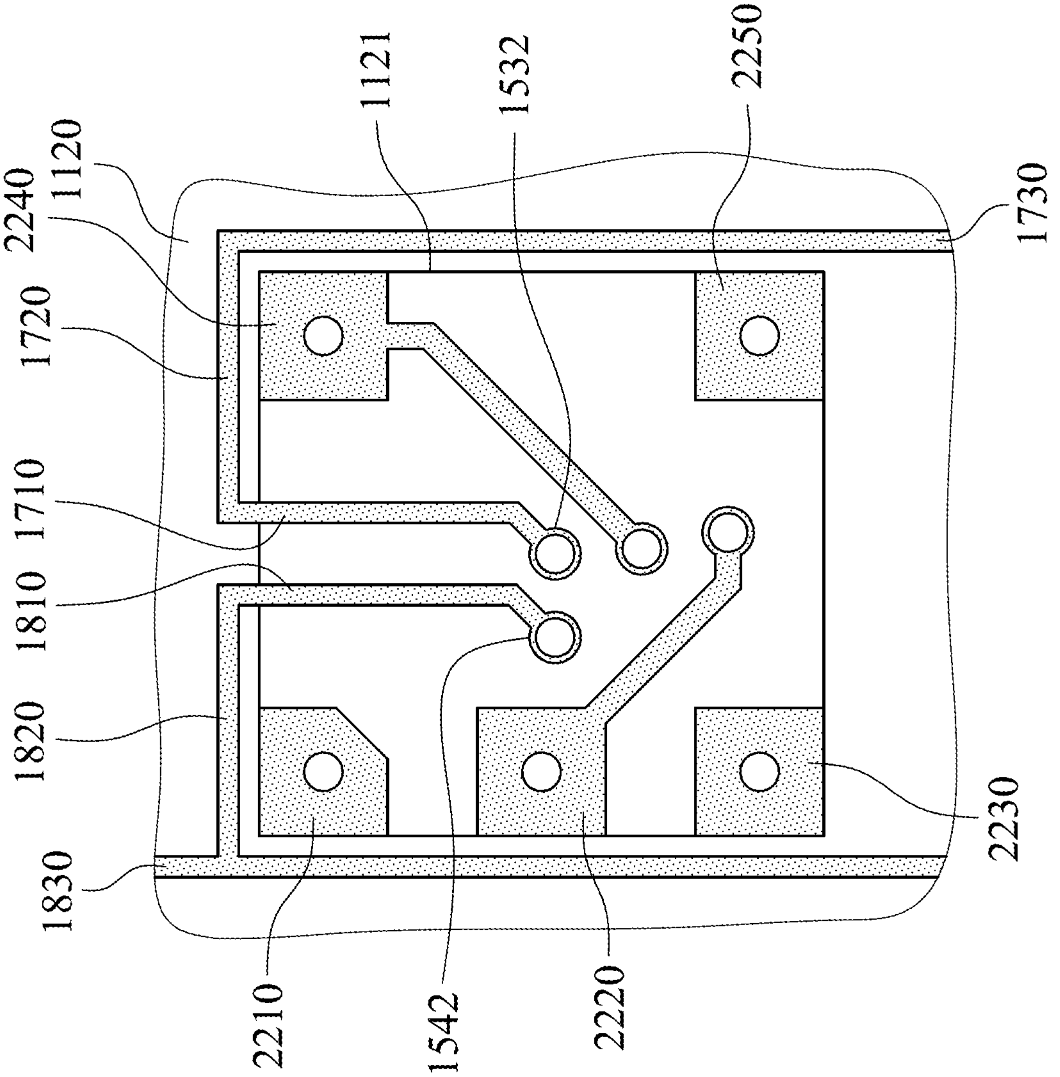
FIG. 3 is a pixel-back-side-pattern region of the LED circuit board structure according to FIG. 1.

FIG. 1 is a top perspective view of an LED circuit board structure 1000 according to one embodiment of the present disclosure. FIG. 2 is a pixel-front-side-pattern region 1111 of the LED circuit board structure 1000 according to FIG. 1. FIG. 3 is a pixel-back-side-pattern region 1121 of the LED circuit board structure 1000 according to FIG. 1. In FIG. 1 to FIG. 3, the LED circuit board structure 1000 includes a carrier board 1100, a plurality of first color LEDs 1210, a plurality of second color LEDs 1310, a plurality of third color LEDs 1410, a plurality of integrated circuit chips 1510, a plurality of first P-type pads 1220, a plurality of second P-type pads 1320, a plurality of third P-type pads 1420, a plurality of first N-type pads 1230, a plurality of second N-type pads 1330, a plurality of third N-type pads 1430, a plurality of first color pads 1520, a plurality of second color pads 1530, a plurality of third color pads 1540, a plurality of first testing wires 1610 and a plurality of first connecting wires 1620.

The carrier board 1100 includes a carrying surface 1110 and a bottom surface 1120 opposite to each other. The carrying surface 1110 includes pixel-front-side-pattern regions 1111 disposed in intervals. The bottom surface 1120 includes pixel-back-side-pattern regions 1121 respectively correspond to the pixel-front-side-pattern regions 1111. One first color LED 1210, one second color LED 1310, one third color LED 1410 and one integrated circuit chip 1510 are disposed in one of the pixel-front-side-pattern regions 1111.

Each of the first color LEDs 1210 includes a first P-type electrode and a first N-type electrode, each of the second color LEDs 1310 includes a second P-type electrode and a second N-type electrode, and each of the third color LEDs 1410 includes a third P-type electrode and a third N-type electrode. Each of the integrated circuit chips 1510 electrically connects each of the first color LEDs 1210, each of the second color LEDs 1310 and each of the third color LEDs 1410. The first P-type pads 1220 are located at the carrying surface 1110 of the carrier board 1100, and one of the first P-type pads 1220 is disposed at one of the pixel-front-side-pattern regions 1111 for mounting one of the first P-type electrodes. The second P-type pads 1320 are located at the carrying surface 1110 of the carrier board 1100, and one of the second P-type pads 1320 is disposed at one of the pixel-front-side-pattern regions 1111 for mounting one of the second P-type electrodes. The third P-type pads 1420 are located at the carrying surface 1110 of the carrier board 1100, and one of the third P-type pads 1420 is disposed at one of the pixel-front-side-pattern regions 1111 for mounting one of the third P-type electrodes. The first N-type pads 1230 are located at the carrying surface 1110 of the carrier board 1100, and one of the first N-type pads 1230 is disposed at one of the pixel-front-side-pattern regions 1111 for mounting one of the first N-type electrodes. The second N-type pads 1330 are located at the carrying surface 1110 of the carrier board 1100, and one of the second N-type pads 1330 is disposed at one of the pixel-front-side-pattern regions 1111 for mounting one of the second N-type electrodes. The third N-type pads 1430 are located at the carrying surface 1110 of the carrier board 1100, and one of the third N-type pads 1430 is disposed at one of the pixel-front-side-pattern regions 1111 for mounting one of the third N-type electrodes.

In this embodiment, each of the first color LEDs 1210, the second color LEDs 1310 and the third color LEDs 1410 has a vertical chip structure. In other embodiments, each of the first color LEDs 1210, the second color LEDs 1310 and the third color LEDs 1410 can have a flip-chip structure or other chip structures. For the first color LED 1210 shown in FIG. 1 to FIG. 3, the first N-type electrode is close to the carrying surface 1110 of the carrier board 1100 and is mounted on the first N-type pad 1230, and the first P-type electrode is mounted to the first P-type pad 1220 via a conducting wire 1240. Similarly, the second N-type electrode is close to the carrying surface 1110 of the carrier board 1100 and is mounted on the second N-type pad 1330, the second P-type electrode is mounted to the second P-type pad 1320 via a conducting wire 1340, the third N-type electrode is close to the carrying surface 1110 of the carrier board 1100 and is mounted on the third N-type pad 1430, and the third P-type electrode is mounted to the third P-type pad 1420 via a conducting wire 1440.

The first color pads 1520 are located at the carrying surface 1110 of the carrier board 1100. One of the first color pads 1520 is disposed at one of the pixel-front-side-pattern regions 1111 for mounting a first pin of one of the integrated circuit chips 1510, and the one of the first color pads 1520 electrically connects the first P-type pad 1220 that is disposed at the same pixel-front-side-pattern region 1111. The second color pads 1530 are located at the carrying surface 1110 of the carrier board 1100. One of the second color pads 1530 is disposed at one of the pixel-front-side-pattern regions 1111 for mounting a second pin of one of the integrated circuit chips 1510, and the one of the second color pads 1530 electrically connects the second P-type pad 1320 that is disposed at the same pixel-front-side-pattern region 1111. The third color pads 1540 are located at the carrying surface 1110 of the carrier board 1100. One of the third color pads 1540 is disposed at one of the pixel-front-side-pattern regions 1111 for mounting a third pin of one of the integrated circuit chips 1510, and the one of the third color pads 1540 electrically connects the third P-type pad 1420 that is disposed at the same pixel-front-side-pattern region 1111.

The first testing wires 1610 are located at the carrying surface 1110 of the carrier board 1100, and one of the first testing wires 1610 is disposed at one of the pixel-front-side-pattern regions 1111 and extends from one of the first P-type pads 1220 or one of the first color pads 1520 that is disposed at the same pixel-front-side-pattern region 1111. Each of the first connecting wires 1620 electrically connects two of the first testing wires 1610 of adjacent two of the pixel-front-side-pattern regions 1111 in parallel.

The LED circuit board structure 1000 further includes back electrode pads 2210, 2220, 2230, 2240, 2250. The back electrode pads 2210 electrically connect the third N-type pads 1430 and the integrated circuit chip 1510. The back electrode pads 2220, 2230, 2240, 2250 electrically connect the integrated circuit chip 1510. The back electrode pads 2210, 2220, 2230, 2240, 2250 are configured to connect with a processor or a controller for driving the integrated circuit chip 1510 to control the first color LED 1210, the second color LED 1310 and the third color LED 1410 after packaging. Therefore, the first color LED 1210, the second color LED 1310 and the third color LED 1410 cannot be tested directly after cutting and packaging.

Through the structure of the first testing wires 1610 and the first connecting wires 1620, electric currents can by-pass the integrated circuit chips 1510 and be directly provided to the first color LEDs 1210 before the carrier board 1100 is cut. In other words, if the first testing wire 1610 extends from the first P-type pad 1220, an electric current can be allowed to flow through the first connecting wire 1620 into the first testing wire 1610 and thus flow through the first P-type pad 1220 into the first color LED 1210 during testing; if the first testing wire 1610 extends from the first color pad 1520, an electric current can be allowed to flow through the first connecting wire 1620 into the first testing wire 1610 and thus flow through the first color pad 1520 and the first P-type pad 1220 into the first color LED 1210 during testing. Furthermore, the first color LEDs 1210 in adjacent pixel-front-side-pattern regions 1111 can be connected in parallel and an electric voltage can thus be applied on multiple first color LEDs 1210 in the LED circuit board structure 1000. Since the first color LEDs 1210 of adjacent pixel-front-side-pattern regions 1111 are connected in parallel, when one of the first color LEDs 1210 fails or not be completely mounted while other first color LEDs 1210 are normal, only the failed or not-completely-mounted first color LED 1210 fails to illuminate, and other first color LEDs 1210 still illuminate. Therefore, the efficiency of testing the first color LEDs 1210 is improved.

Further, the LED circuit board structure 1000 can further include a plurality of second testing wires 1710, a plurality of second connecting wires 1720, a plurality of third testing wires 1810 and a plurality of third connecting wires 1820. The second testing wires 1710 are located at the bottom surface 1120 of the carrier board 1100. One of the second testing wires 1710 is disposed at one of the pixel-back-side-pattern regions 1121 and electrically connects the second P-type pad 1320 or the second color pad 1530 that is disposed at the pixel-front-side-pattern region 1111 where the one of the pixel-back-side-pattern 1121 corresponds. For example, in FIG. 1 to FIG. 3, the second testing wire 1710 of each of the pixel-back-side-pattern regions 1121 is electrically connected to the second color pad 1530 of each of the pixel-front-side-pattern regions 1111 through a conducting hole 1532. Each of the second connecting wires 1720 electrically connects two of the second testing wires 1710 of adjacent two of the pixel-back-side-pattern regions 1121 in parallel. The third testing wires 1810 are located at the bottom surface 1120 of the carrier board 1100. One of the third testing wires 1810 is disposed at one of the pixel-back-side-pattern regions 1121 and electrically connects the third P-type pad 1420 or the third color pad 1540 that is disposed at the pixel-front-side-pattern region 1111 where the one of the pixel-back-side-pattern 1121 corresponds. For example, in FIG. 1 to FIG. 3, the third testing wire 1810 of each of the pixel-back-side-pattern regions 1121 is electrically connected to the third color pad 1540 of each of the pixel-front-side-pattern regions 1111 through a conducting hole 1542. Each of the third connecting wires 1820 electrically connects two of the third testing wires 1810 of adjacent two of the pixel-back-side-pattern regions 1121 in parallel.

Similar to the first testing wires 1610 and the first connecting wires 1620, through the structures of the second testing wires 1710, the second connecting wires 1720, the third testing wires 1810 and the third connecting wires 1820, the efficiency of testing the second color LEDs 1310 and the third color LEDs 1410 can be improved.

In FIG. 1 to FIG. 3, each of the first N-type pads 1230, each of the second N-type pads 1330 and each of the third N-type pads 1430 are electrically connected, and the LED circuit board structure 1000 further includes a plurality of fourth connecting wires 1910. The fourth connecting wires 1910 are located at the carrying surface 1110 of the carrier board 1100, and each of the fourth connecting wires 1910 electrically connects two of the first N-type pads 1230, two of the second N-type pads 1330 and two of the third N-type pads 1430 of adjacent two of the pixel-front-side-pattern regions 1111 in parallel.

Figure 4:
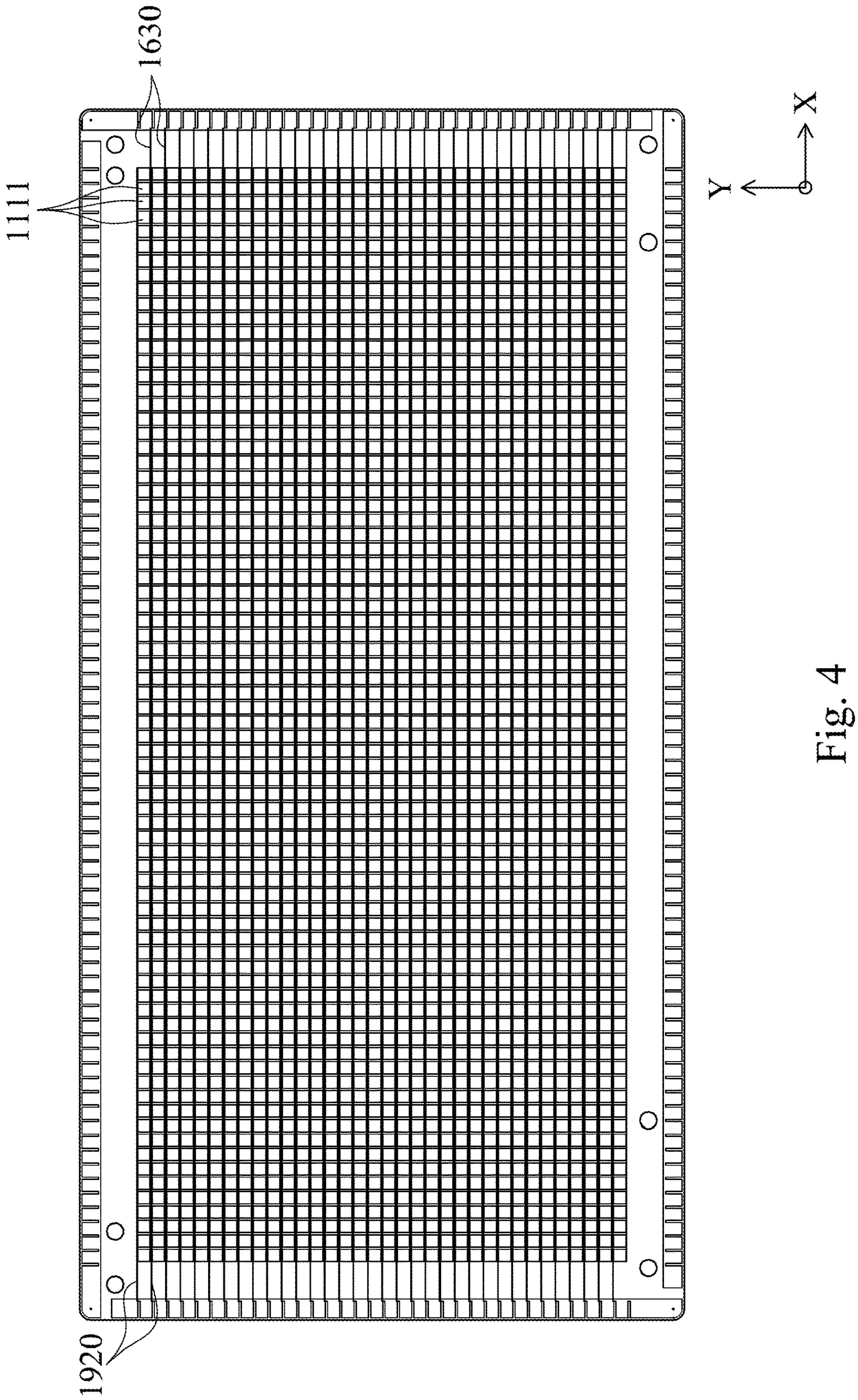
FIG. 4 is a carrying surface of the LED circuit board structure according to FIG. 1.
Figure 5:
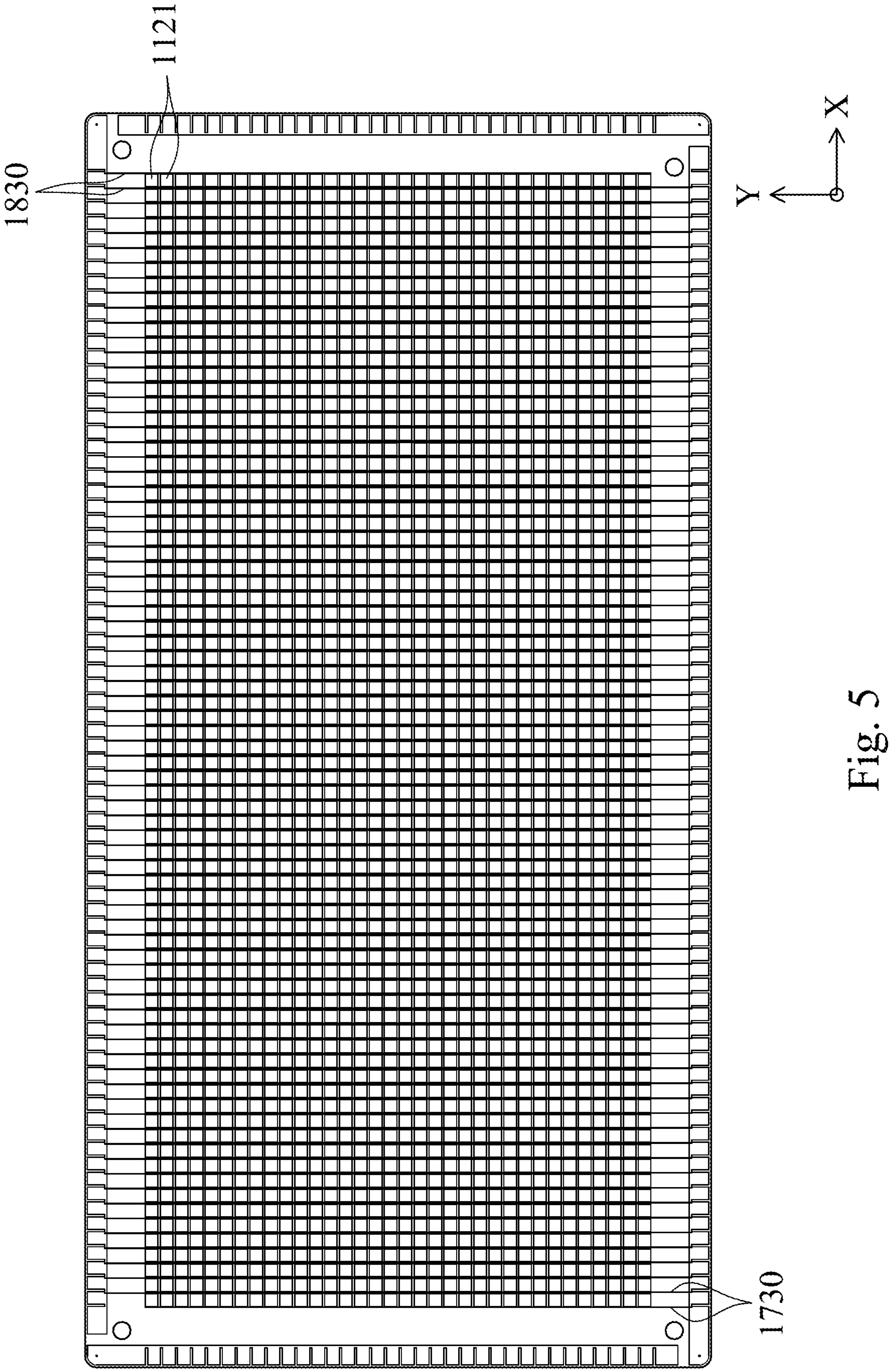
FIG. 5 is a bottom surface of the LED circuit board structure according to FIG. 1.

The wiring layout of the LED circuit board structure 1000 is further illustrated bellow. FIG. 4 is a carrying surface 1110 of the LED circuit board structure 1000 according to FIG. 1. FIG. 5 is a bottom surface 1120 of the LED circuit board structure 1000 according to FIG. 1. Please refer to FIG. 1 to FIG. 5, in this embodiment, the LED circuit board structure 1000 further includes a plurality of first data wires 1630, a plurality of second data wires 1730, a plurality of third data wires 1830 and a plurality of fourth data wires 1920. Each of the first data wires 1630 and each of the fourth data wires 1920 extend along a first direction X and respectively electrically connect the first connecting wires 1620 and the fourth connecting wires 1910, and each of the second data wires 1730 and each of the third data wires 1830 extend along a second direction Y and respectively electrically connect the second connecting wires 1720 and the third connecting wires 1820.

Therefore, fixtures having multiple probes can be clipped on the edge of the carrier board 1100, and each probe can respectively electrically connect one of first data wires 1630, second data wires 1730, third data wire 1830 and fourth data wire 1920. Signals can be input through the probes to the first color LEDs 1210, the second color LEDs 1310, and the third color LEDs 1410. For example, input signals can be configured to be simultaneously applied on the first color LEDs 1210 of the same row along the first direction X. If there are first color LEDs 1210 that do not illuminate, then those first color LEDs 1210 can be determined to be abnormal, and can be replaced or be re-mounted to confirm accordingly. Otherwise, input signals can be configured to be applied on the first color LEDs 1210 of the same row by turns. Using an automated optical inspection system, the optical image of the LED circuit board structure 1000 corresponding to each moment that an electric voltage being applied to each first color LED 1210 can be captured, the analysis can then be carried out to determine whether the nth first color LED 1210 illuminates when the electric voltage applies on, and more precise results can be achieved. Similar methods can be used to test the second color LEDs 1310 and the third color LEDs 1410.

In FIG. 1 to FIG. 3, the LED circuit board structure 1000 further includes a plurality of cutting lanes 2100 located at the carrier board 1100. The first connecting wires 1620, the second connecting wires 1720, the third connecting wires 1820 and the fourth connecting wires 1910 are located at the cutting lanes 2100. Therefore, the tested LED circuit board structure 1000 can be cut along the cutting lanes 2100. If the first connecting wires 1620, the second connecting wires 1720, the third connecting wires 1820 and the fourth connecting wires 1910 are partially located at the pixel-front-side-pattern regions 1111 and partially located at the cutting lanes 2100, the first connecting wires 1620, the second connecting wires 1720, the third connecting wires 1820 and the fourth connecting wires 1910 can be cut; if the first testing wires 1610, the second testing wires 1710 and the third testing wires 1810 extend to the cutting lanes 2100 and the first connecting wires 1620, the second connecting wires 1720 and, the third connecting wires 1820 and the fourth connecting wires 1910 are totally located at the cutting lanes 2100, the first testing wires 1610, the second testing wires 1710 and the third testing wires 1810 and the fourth connecting wires 1910 can be cut to remove the parallel connecting relation between the first color LEDs 1210, the second color LEDs 1310 and the third color LEDs 1410 in different pixel-front-side-pattern regions 1111 such that the pixel-front-side-pattern regions 1111 turn back to independent state. Through the wiring structure the first connecting wires 1620, the second connecting wires 1720, the third connecting wires 1820 and the fourth connecting wires 1910 of this embodiment, the first connecting wires 1620, the second connecting wires 1720, the third connecting wires 1820 and the fourth connecting wires 1910 can be completely cut off or removed after cutting the carrier board 1100 to avoid short problems.

To achieve the above benefits, the line widths and the line distances of the wires of the LED circuit board structure 1000 can be adjusted according to the demands. In this embodiment, the line widths of each first data wire 1630, each second data wire 1730, each third data wire 1830 and each fourth data wire 1920 are in a range of 25 μm to 40 μm, and the line distance between one of the first data wires 1630 and one of the fourth data wires 1920 adjacent thereto, and the line distance of one of the second data wires 1730 and one of the third data wires 1830 adjacent thereto are in a range of 40 μm to 50 μm. In the above ranges, normal operations of the LED circuit board structure 1000 under operating currents can be ensured, and the transverse electric field between the wires can be avoided to avoid sudden short. Meanwhile, appropriate line widths and line distances allow the first data wires 1630, the second data wires 1730, the third data wires 1830 and the fourth data wires 1920 to be accommodated in the cutting lanes 2100 for the cutting process. Since the first data wires 1630, the second data wires 1730, the third data wires 1830 and the fourth data wires 1920 do not occupy additional spaces, the package quantities made out of a unit carrier board 1100 can be retained, and the best utility rate of the carrier board 1100 can be achieved.

Figure 6:
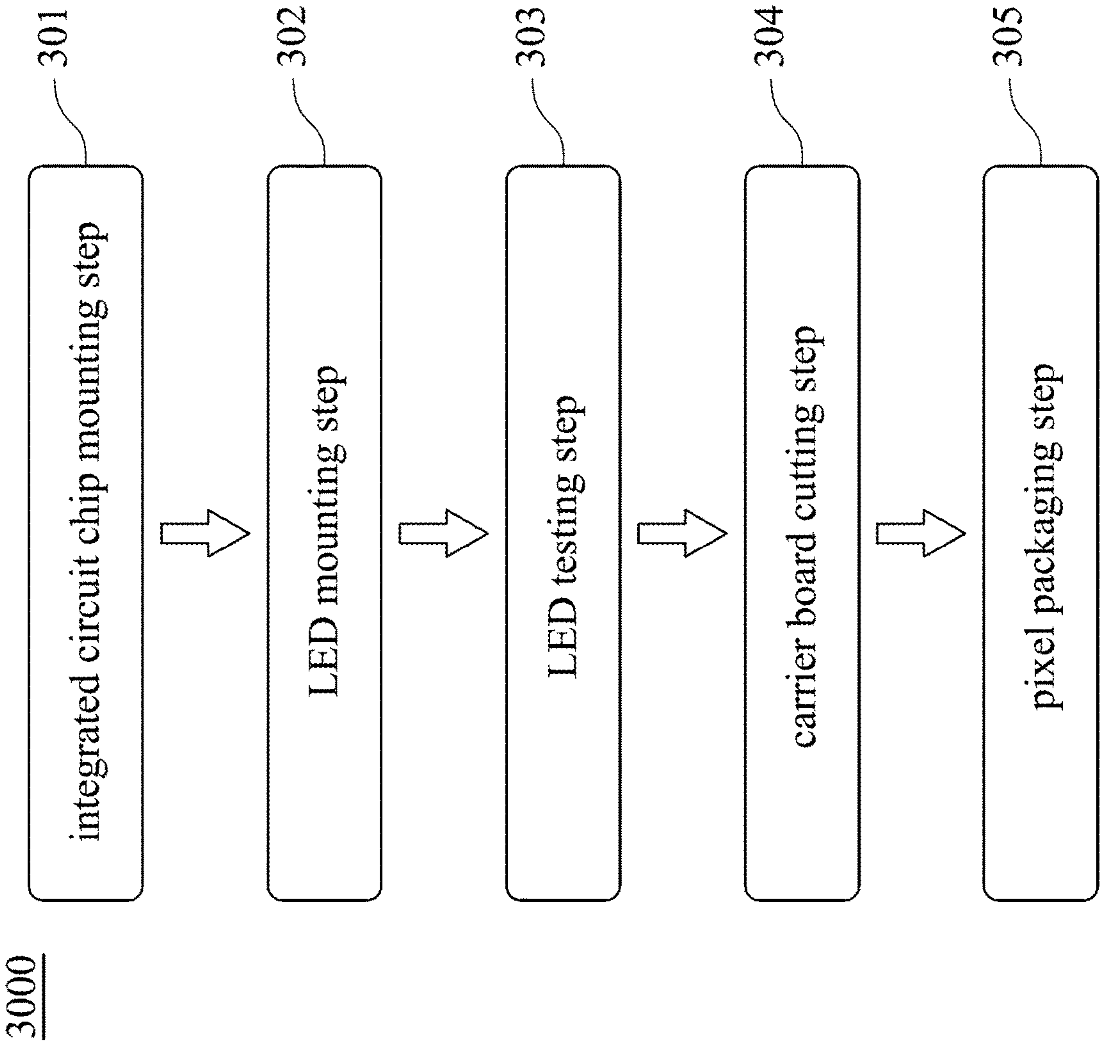
FIG. 6 is a block flow diagram of an LED testing and packaging method according to another embodiment of the present disclosure.
Figure 7:
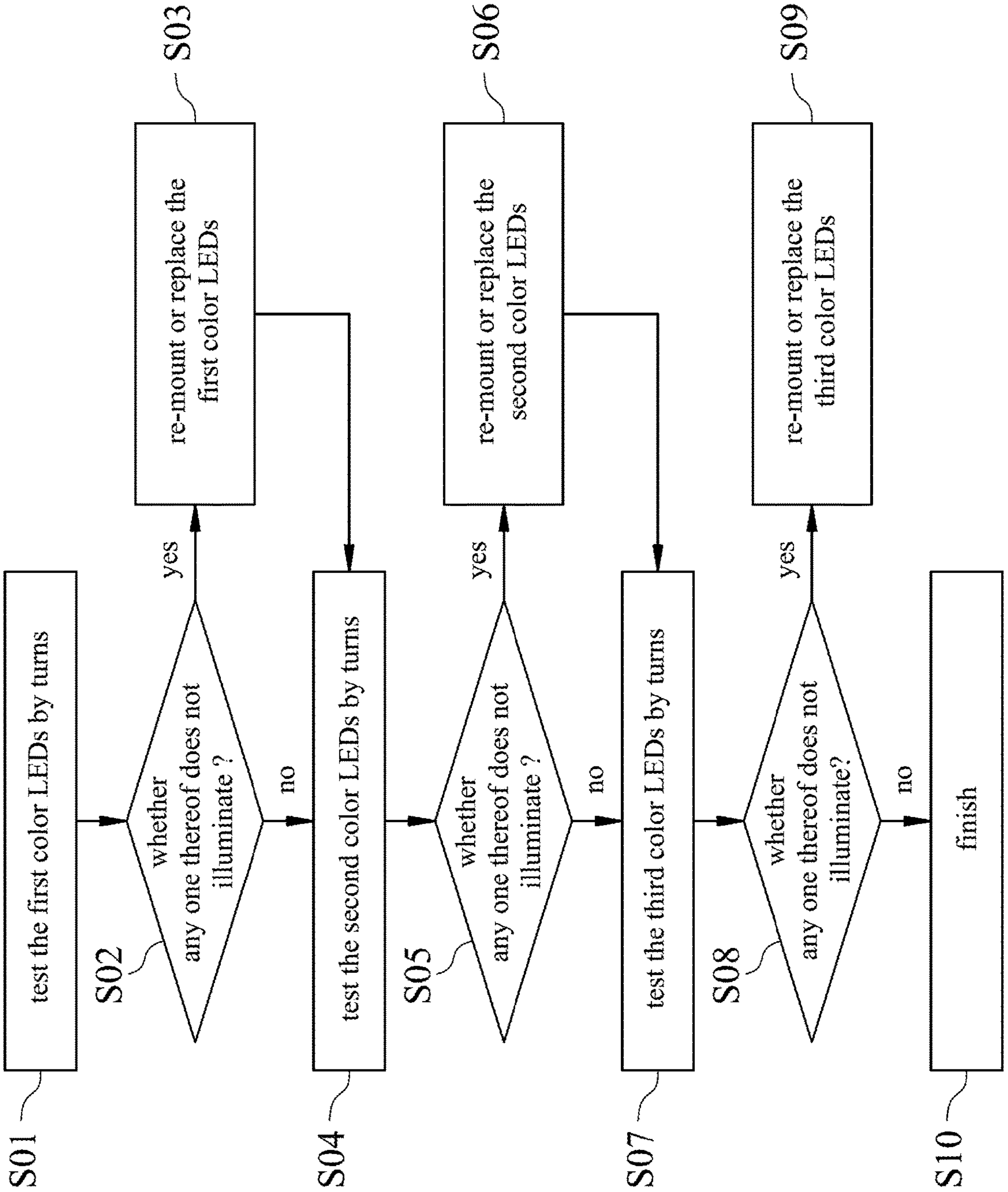
FIG. 7 is a detail flow diagram of the LED testing step of the LED testing and packaging method according to FIG. 6.
Figure 8:
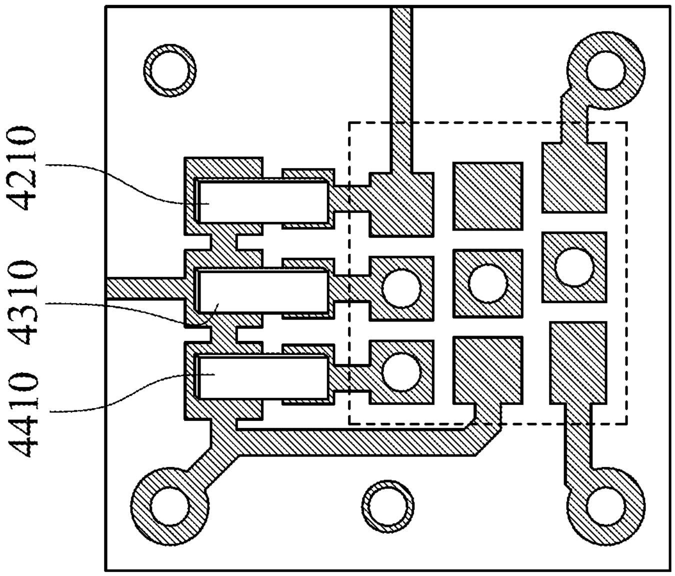
FIG. 8 is a top perspective view of a pixel to be packaged formed after the carrier board is cut in the LED testing and packaging method according to FIG. 6.

Please refer to FIG. 6 to FIG. 8 and FIG. 1 to FIG. 3. FIG. 6 is a block flow diagram of an LED testing and packaging method 3000 according to another embodiment of the present disclosure. FIG. 7 is a detail flow diagram of the LED testing step 303 of the LED testing and packaging method 3000 according to FIG. 6. FIG. 8 is a top perspective view of a pixel to be packaged 4000 formed after the carrier board 1100 is cut in the LED testing and packaging method 3000 according to FIG. 6. In FIG. 6, the LED testing and packaging method 3000 includes an integrated circuit chip mounting step 301, an LED mounting step 302, an LED testing step 303, a carrier board cutting step 304 and a pixel packaging step 305. In the integrated circuit chip mounting step 301, a plurality of integrated circuit chips 1510 are mounted to a circuit board. In the LED mounting step 302, a plurality of first color LEDs 1210, a plurality of second color LEDs 1310 and a plurality of third color LEDs 1410 are mounted to the circuit board. For example, the LED circuit board structure 1000 of the embodiment in FIG. 1 can be divided into a part including the first color LEDs 1210, the second color LEDs 1310, the third color LEDs 1410 and the integrated circuit chips 1510 and a rest part expect of the first color LEDs 1210, the second color LEDs 1310, the third color LEDs 1410 and the integrated circuit chips 1510 (which can be viewed as the circuit board of this embodiment). The circuit board includes a carrier board 1100, a plurality of first P-type pads 1220, a plurality of first color pads 1520, a plurality of first testing wires 1610, a plurality of first connecting wires 1620 and a plurality of cutting lanes 2100. The carrier board 1100 includes a carrying surface 1110 and a bottom surface 1120 opposite to each other. The carrying surface 1110 includes a plurality of pixel-front-side-pattern regions 1111 disposed in intervals. The bottom surface 1120 includes a plurality of pixel-back-side-pattern regions 1121 respectively corresponds to the pixel-front-side-pattern regions 1111. The first P-type pads 1220 are located at the carrying surface 1110 of the carrier board 1100, and one of the first P-type pads 1220 is disposed at one of the pixel-front-side-pattern regions 1111 for mounting one of the first color LEDs 4210. The first color pads 1520 are located at the carrying surface 1110 of the carrier board 1100. One of the first color pads 1520 is disposed at one of the pixel-front-side-pattern regions 1111 for mounting a first pin of one of the integrated circuit chips 1510, and the one of the first color pads 1520 electrically connects the first P-type pads 1220 that is disposed at the same pixel-front-side-pattern region 1111. The first testing wires 1610 are located at the carrying surface 1110 of the carrier board 1100. One of the first testing wires 1610 is disposed at one of the pixel-front-side-pattern regions 1111 and extends from the first P-type pad 1220 or the first color pad 1520 that is disposed at the same pixel-front-side-pattern region 1111. Each of the first connecting wires 1620 electrically connects two of the first testing wires 1610 of adjacent two of the pixel-front-side-pattern regions 1111 in parallel. The cutting lanes 2100 are located at the carrier board 1100 and are located between each of the pixel-front-side-pattern regions 1111. A part of each of the first connecting wires 1620 is located at the cutting lanes 2100.

In the LED testing step 303, the first connecting wires 1620 are powered to test each of the first color LEDs 4210. The detail flow diagram of the LED testing step 303 is shown in FIG. 7. In step S01, test the first color LEDs 1210 by turns. An electric current flows from one of the first connecting wires 1620 into one of the first testing wires 1610 and flows into one of the first color LEDs 1210 through one of the first P-type pads 1220 or through one of the first color pads 1520 and one of the first P-type pads 1220. In step S02, determine whether there are first color LEDs 1210 that do not illuminate. If there are first color LEDs 1210 that do not illuminate, move to step S03, and re-mount or replace the first color LEDs 1210; if there are no abnormal first color LED 1210, move to step S04, and test the second color LEDs 1310 by turns. In step S05, determine whether there are second color LEDs 1310 that do not illuminate. If there are second color LEDs 1310 that do not illuminate, move to step S06, and re-mount or replace the second color LEDs 1310; if there are no abnormal second color LED 1310, move to step S07, and test the third color LEDs 1410 by turns. In step S08, determine whether there are third color LEDs 1410 that do not illuminate. If there are third color LEDs 1410 that do not illuminate, move to step S09, and re-mount or replace the third color LEDs 1410; if there are no third color LED 1410 that do not illuminate, move to step S10, and finish the LED testing step 303. In the LED testing step 303 of this embodiment, the first color LEDs 1210, the second color LEDs 1310 and the third color LEDs 1410 can be tested one by one or row/column by row/column.

In carrier board cutting step 304, the carrier board 1100 is cut along the cutting lanes 2100 such that the pixel-front-side-pattern regions 1111 separate from each other and the first connecting wires 1620 or the first testing wires 1610 are cutting off to form a plurality of pixels to be packaged. In FIG. 8, one of the pixels to be packaged is shown, the first color LED 4210, the second color LED 4310 and the third color LED 4410 are illustrated as directly bridge over without conducting wires, which means that each of the first color LED 4210, the second color LED 4310 and the third color LED 4410 can have a flip-chip structure. It is known that, in the pixel to be packaged, the first color LED 4210, the second color LED 4310 and the third color LED 4410 can be the first color LED 1210, the second color LED 1310 and the third color LED 1410, respectively, and the present disclosure is not limited thereto. In the pixel packaging step 305, the separated pixels to be packaged are sealed to form a plurality of LED pixel packages. Moreover, in the carrier board cutting step 304 of this embodiment, the first testing wires 1610 can be cut. In other embodiments, the first connecting wires are cut if a part of each of the first connecting wires is located at the pixel-front-side-pattern regions and the rest of the first connecting wire is located at the cutting lanes, while the first testing wires do not extend to the cutting lanes.

In the LED testing packaging method, through executing the pixel packaging step 305 after the LED testing step 303, abnormal first color LEDs 1210, second color LEDs 1310 and third color LEDs 1410 can be found out and replaced or re-mounted timely. Therefore, discarding normal first color LEDs 1210, second color LEDs 1310 or third color LEDs 1410 that are sealed with the abnormal first color LEDs 1210, second color LEDs 1310 or third color LEDs 1410 can be avoided, and cost can be saved.

Figure 9:
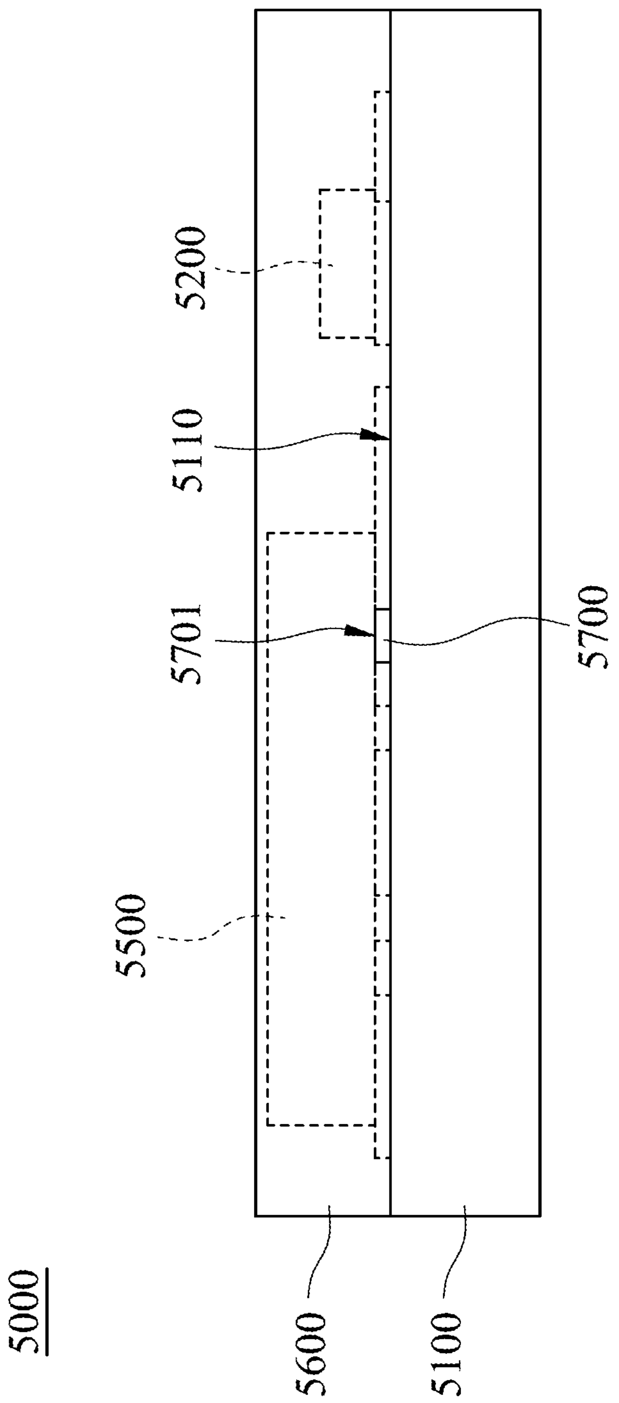
FIG. 9 is a side view of an LED pixel package according to still another embodiment of the present disclosure.

FIG. 9 is a side view of an LED pixel package 5000 according to still another embodiment of the present disclosure. Because the wiring structure of the LED pixel package 5000 is the same as the wiring structure in one pixel-front-side-pattern region 1111 and one pixel-back-side-pattern region 1121 in FIG. 1 to FIG. 3, and is the same as the wiring structure of the pixel to be packaged 4000 shown in FIG. 8 as well, only the side view is depicted in FIG. 9. In FIGS. 1 to 3 and 9, the LED pixel package 5000 includes a carrier board 5100, a first color LED 5200, a second color LED, a third color LED, an integrated circuit chip 5500, a sealing layer 5600 and a first wire set 5700. The first color LED 5200, the second color LED and the third color LED are disposed at the carrying surface 5110 of the carrier board 5100. The integrated circuit chip 5500 electrically connects the first color LED 5200, the second color LED and the third color LED. The first wire set 5700 (corresponding to the first testing wires 1610 and the first connecting wires 1620 in FIG. 2) is disposed at the carrying surface 5110 and electrically connects the first color LED 5200 and the integrated circuit chip 5500. A part of the first wire set 5700 (corresponding to a part of the first testing wire 1610) extends to the edge of the carrier board 5100 from the first color LED 5200 or the integrated circuit chip 5500. The difference between this embodiment and the embodiment of FIG. 1 to FIG. 3 is that the LED pixel package 5000 includes a sealing layer 5600 covering the first color LED 5200, the second color LED, the third color LED and the integrated circuit chip 5500, and that in the LED pixel package 5000, the first wire set 5700 is cut off and a metal break surface at the edge of the carrier board 5100 is formed. Observing from the side of the LED pixel package 5000, the top surface 5701 of the part of the first wire set 5700 that extends to the edge of the carrier board 5100 is higher than the carrying surface 5110 of the carrier board 5100. The second wire set (corresponding to the second testing wire 1710 and the second connecting wire 1720 in FIG. 3) and the third wire set (corresponding to the third testing wire 1810 and the third connecting wire 1820 in FIG. 3) can similarly form metal break surfaces at other edges of the carrier board 5100, and the details are not repeated.

In other words, as shown in FIG. 1 to FIG. 3 and FIG. 9, since a part of each of the first testing wires 1610 extends to the cutting lane 2100, the first testing wires 1610 are only cut off but not totally removed from the pixel-front-side-pattern regions 1111 after cutting. Therefore, the metal break surface is retained at the edge of the carrier board 5100 of the LED pixel package 5000, while the electric characteristics of the LED pixel package 5000 are not affected.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An LED circuit board structure, comprising:

a plurality of first color LEDs, each of the first color LEDs comprising a first P-type electrode and a first N-type electrode;

a plurality of second color LEDs, each of the second color LEDs comprising a second P-type electrode and a second N-type electrode;

a plurality of third color LEDs, each of the third color LEDs comprising a third P-type electrode and a third N-type electrode;

a plurality of integrated circuit chips, each of the integrated circuit chips electrically connecting each of the first color LEDs, each of the second color LEDs and each of the third color LEDs;

a carrier board comprising a carrying surface and a bottom surface opposite to each other, the carrying surface comprising a plurality of pixel-front-side-pattern regions disposed in intervals, the bottom surface comprising a plurality of pixel-back-side-pattern regions respectively corresponding to the pixel-front-side-pattern regions, wherein one of the first color LEDs, one of the second color LEDs, one of the third color LEDs and one of the integrated circuit chips are disposed in one of the pixel-front-side-pattern regions;

a plurality of first P-type pads located at the carrying surface of the carrier board, wherein one of the first P-type pads is disposed at one of the pixel-front-side-pattern regions for mounting one of the first P-type electrodes;

a plurality of second P-type pads located at the carrying surface of the carrier board, wherein one of the second P-type pads is disposed at one of the pixel-front-side-pattern regions for mounting one of the second P-type electrodes;

a plurality of third P-type pads located at the carrying surface of the carrier board, wherein one of the third P-type pads is disposed at one of the pixel-front-side-pattern regions for mounting one of the third P-type electrodes;

a plurality of first color pads located at the carrying surface of the carrier board, wherein one of the first color pads is disposed at one of the pixel-front-side-pattern regions for mounting a first pin of the integrated circuit chip that is disposed at the same pixel-front-side-pattern region, and for electrically connecting the first P-type pad that is disposed at the same pixel-front-side-pattern region;

a plurality of second color pads located at the carrying surface of the carrier board, wherein one of the second color pads is disposed at one of the pixel-front-side-pattern regions for mounting a second pin of the integrated circuit chip that is disposed at the same pixel-front-side-pattern region, and for electrically connecting the second P-type pad that is disposed at the same pixel-front-side-pattern region;

a plurality of third color pads located at the carrying surface of the carrier board, wherein one of the third color pads is disposed at one of the pixel-front-side-pattern regions for mounting a third pin of the integrated circuit chip that is disposed at the same pixel-front-side-pattern region, and for electrically connecting the third P-type pad that is disposed at the same pixel-front-side-pattern region;

a plurality of first testing wires located at the carrying surface of the carrier board, wherein one of the first testing wires is disposed at one of the pixel-front-side-pattern regions and extends from the first color pad that is disposed at the same pixel-front-side-pattern region;

a plurality of first connecting wires, each of the first connecting wires electrically connecting two of the first testing wires of adjacent two of the pixel-front-side-pattern regions in parallel;

a plurality of first data wires, each of the first data wires extending along a first direction;

a plurality of second testing wires located at the bottom surface of the carrier board, wherein one of the second testing wires is disposed at one of the pixel-back-side-pattern regions and electrically connects the second color pads that is disposed at the pixel-front-side-pattern region where the one of the pixel-back-side-pattern corresponds;

a plurality of second connecting wires, each of the second connecting wires electrically connecting two of the second testing wires of adjacent two of the pixel-back-side-pattern regions in parallel;

a plurality of second data wires, each of the second data wires extending along a second direction;

a plurality of third testing wires located at the bottom surface of the carrier board, wherein one of the third testing wires is disposed at one of the pixel-back-side-pattern regions and electrically connects the third color pads that is disposed at the pixel-front-side-pattern region where the one of the pixel-back-side-pattern corresponds;

a plurality of third connecting wires, each of the third connecting wires electrically connecting two of the third testing wires of adjacent two of the pixel-back-side-pattern regions in parallel; and a plurality of third data wires, each of the third data wires extending along the second direction;

wherein the first color LEDs are arranged in a plurality of rows parallel to the first direction, each of the first data wires is signally connected to the first connecting wires of each of the rows, and each of the first data wires is powered to test the first color LEDs of each of the rows;

wherein the second color LEDs are arranged in a plurality of columns parallel to the second direction, each of the second data wires is signally connected to the second connecting wires of each of the columns, and each of the second data wires is powered to test the second color LEDs of each of the columns;

wherein the third color LEDs are arranged in the rows, each of the third data wires is signally connected to the third connecting wires of each of the rows, and each of the third data wires is powered to test the third color LEDs of each of the rows.

2. The LED circuit board structure of claim 1, wherein each of the second testing wires of each of the pixel-back-side-pattern regions electrically connects each of the second color pads via a conducting hole, and each of the third testing wires of each of the pixel-back-side-pattern regions electrically connects each of the third color pads via another conducting hole.

3. The LED circuit board structure of claim 2, further comprising:

a plurality of first N-type pads located at the carrying surface of the carrier board, one of the first N-type pads is disposed at one of the pixel-front-side-pattern regions for mounting one of the first N-type electrodes;

a plurality of second N-type pads located at the carrying surface of the carrier board, one of the second N-type pads is disposed at one of the pixel-front-side-pattern regions for mounting one of the second N-type electrodes;

a plurality of third N-type pads located at the carrying surface of the carrier board, one of the third N-type pads is disposed at one of the pixel-front-side-pattern regions for mounting one of the third N-type electrodes, wherein each of the first N-type pads, each of the second N-type pads and each of the third N-type pads are electrically connected; and a plurality of fourth connecting wires located at the carrying surface of the carrier board, each of the fourth connecting wires electrically connecting two of the first N-type pads, two of the second N-type pads and two of the third N-type pads of adjacent two of the pixel-front-side-pattern regions in parallel.

4. The LED circuit board structure of claim 3, further comprising a plurality of cutting lanes located at the carrier board, wherein the first connecting wires, the second connecting wires, the third connecting wires and the fourth connecting wires are located at the cutting lanes.

5. The LED circuit board structure of claim 4, further comprising a plurality of fourth data wires, wherein each of the fourth data wires extend along the first direction and electrically connect the fourth connecting wires.

6. The LED circuit board structure of claim 5, wherein line widths of each of the first data wires, each of the second data wires, each of the third data wires and each of the fourth data wires are in a range of 25 μm to 40 μm, and a line distance between one of the first data wires and one of the fourth data wires adjacent thereto, and a line distance of one of the second data wires and one of the third data wires adjacent thereto are in a range of 40 μm to 50 μm.

* * * * *